United States Patent
Hoeglauer et al.

(10) Patent No.: US 9,991,183 B2
(45) Date of Patent: Jun. 5, 2018

(54) SEMICONDUCTOR COMPONENT HAVING INNER AND OUTER SEMICONDUCTOR COMPONENT HOUSINGS

(71) Applicant: Infineon Technologies Austria AG, Villach (AT)

(72) Inventors: Josef Hoeglauer, Heimstetten (DE); Teck Sim Lee, Melaka (MY); Ralf Otremba, Kaufbeuren (DE); Klaus Schiess, Allensbach (DE); Xaver Schloegel, Sachsenkam (DE); Juergen Schredl, Mering (DE)

(73) Assignee: Infineon Technologies Austria AG, Villach (AT)

( * ) Notice: Subject to any disclaimer, the term of this patent is extended or adjusted under 35 U.S.C. 154(b) by 26 days.

(21) Appl. No.: 14/879,904

(22) Filed: Oct. 9, 2015

(65) Prior Publication Data
US 2016/0111346 A1  Apr. 21, 2016

(30) Foreign Application Priority Data
Oct. 15, 2014 (DE) .................. 10 2014 114 933

(51) Int. Cl.
| | |
|---|---|
| *H01L 23/08* | (2006.01) |
| *H01L 23/31* | (2006.01) |
| *H01L 23/00* | (2006.01) |
| *H01L 25/03* | (2006.01) |
| *H01L 23/495* | (2006.01) |

(52) U.S. Cl.
CPC ...... *H01L 23/3135* (2013.01); *H01L 23/4952* (2013.01); *H01L 23/49541* (2013.01); *H01L 24/34* (2013.01); *H01L 25/03* (2013.01); *H01L 23/49503* (2013.01); *H01L 23/49513* (2013.01); *H01L 23/49551* (2013.01); *H01L 23/49575* (2013.01); *H01L 2224/04026* (2013.01);

(Continued)

(58) Field of Classification Search
CPC .................................................. H01L 23/3135
See application file for complete search history.

(56) References Cited

U.S. PATENT DOCUMENTS

| | | | |
|---|---|---|---|
| 6,677,672 B2 | 1/2004 | Knapp et al. | |
| 9,312,198 B2 * | 4/2016 | Meyer | ............ H01L 23/31 |

(Continued)

FOREIGN PATENT DOCUMENTS

| | | |
|---|---|---|
| CN | 1649146 A | 8/2005 |
| DE | 102012112769 A1 | 6/2013 |

(Continued)

*Primary Examiner* — Eugene Lee
(74) *Attorney, Agent, or Firm* — Murphy, Bilak & Homiller, PLLC

(57) ABSTRACT

A semiconductor component includes an inner semiconductor component housing and an outer semiconductor component housing. The inner semiconductor component housing includes a semiconductor chip, a first plastic housing composition and first housing contact surfaces. At least side faces of the semiconductor chip are embedded in the first plastic housing composition and the first housing contact surfaces are free of the first plastic housing composition and include a first arrangement. The outer semiconductor component housing includes a second plastic housing composition and second housing contact surfaces which include a second arrangement. The inner semiconductor component housing is situated within the outer semiconductor component housing and is embedded in the second plastic housing composition. At least one of the first housing contact surfaces is electrically connected with at least one of the second housing contact surfaces.

20 Claims, 5 Drawing Sheets

(52) U.S. Cl.
CPC .............. *H01L 2224/04042* (2013.01); *H01L 2224/0603* (2013.01); *H01L 2224/32245* (2013.01); *H01L 2224/37599* (2013.01); *H01L 2224/48091* (2013.01); *H01L 2224/48247* (2013.01); *H01L 2224/4903* (2013.01); *H01L 2224/73221* (2013.01); *H01L 2224/73263* (2013.01); *H01L 2224/73265* (2013.01); *H01L 2224/84801* (2013.01); *H01L 2924/00014* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 2007/0246808 A1 | 10/2007 | Ewe et al. | |
| 2007/0284720 A1* | 12/2007 | Otremba | H01L 23/49524 257/690 |
| 2010/0193921 A1 | 8/2010 | Jereza et al. | |
| 2013/0161801 A1* | 6/2013 | Otremba | H01L 23/24 257/668 |
| 2013/0307145 A1 | 11/2013 | Chung et al. | |
| 2014/0001615 A1* | 1/2014 | Otremba | H01L 23/3107 257/676 |

FOREIGN PATENT DOCUMENTS

| | | |
|---|---|---|
| DE | 102013104952 A1 | 11/2013 |
| DE | 102013106577 A1 | 1/2014 |
| DE | 102013112592 A1 | 5/2014 |

\* cited by examiner

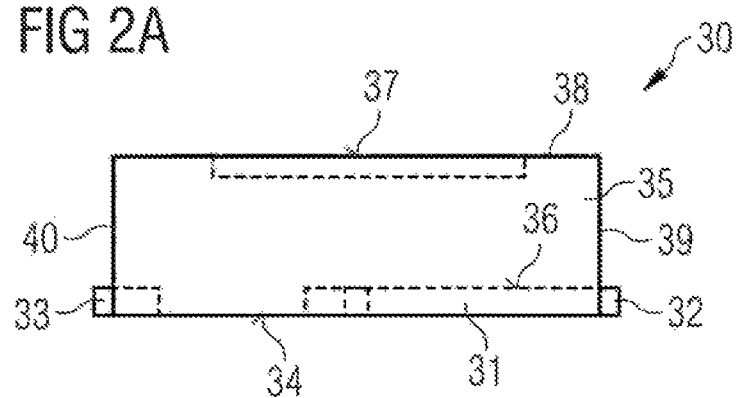
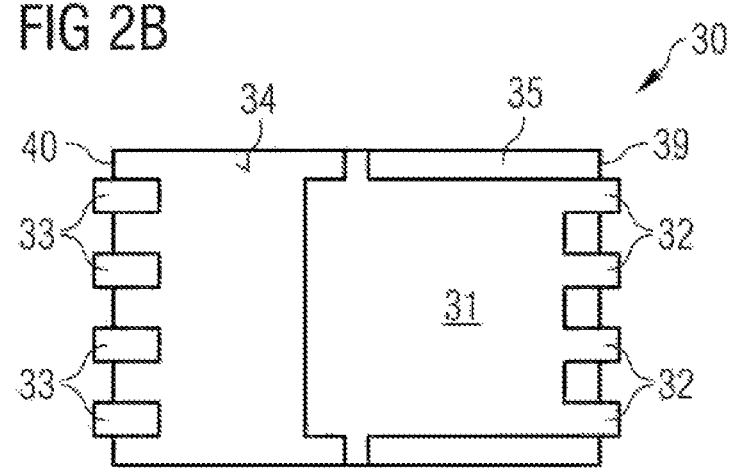
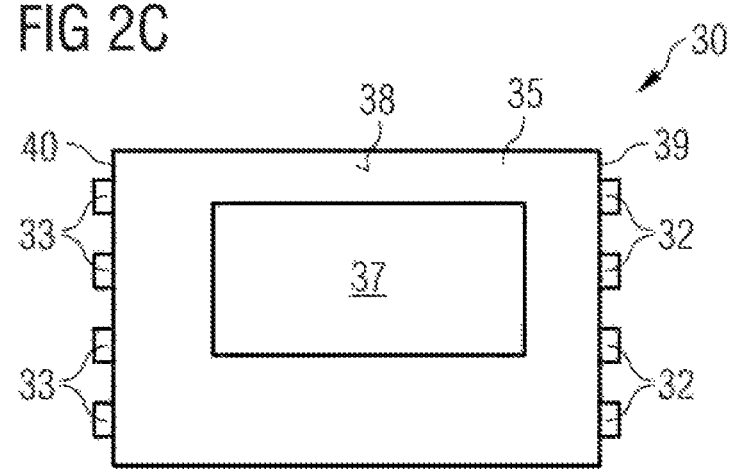

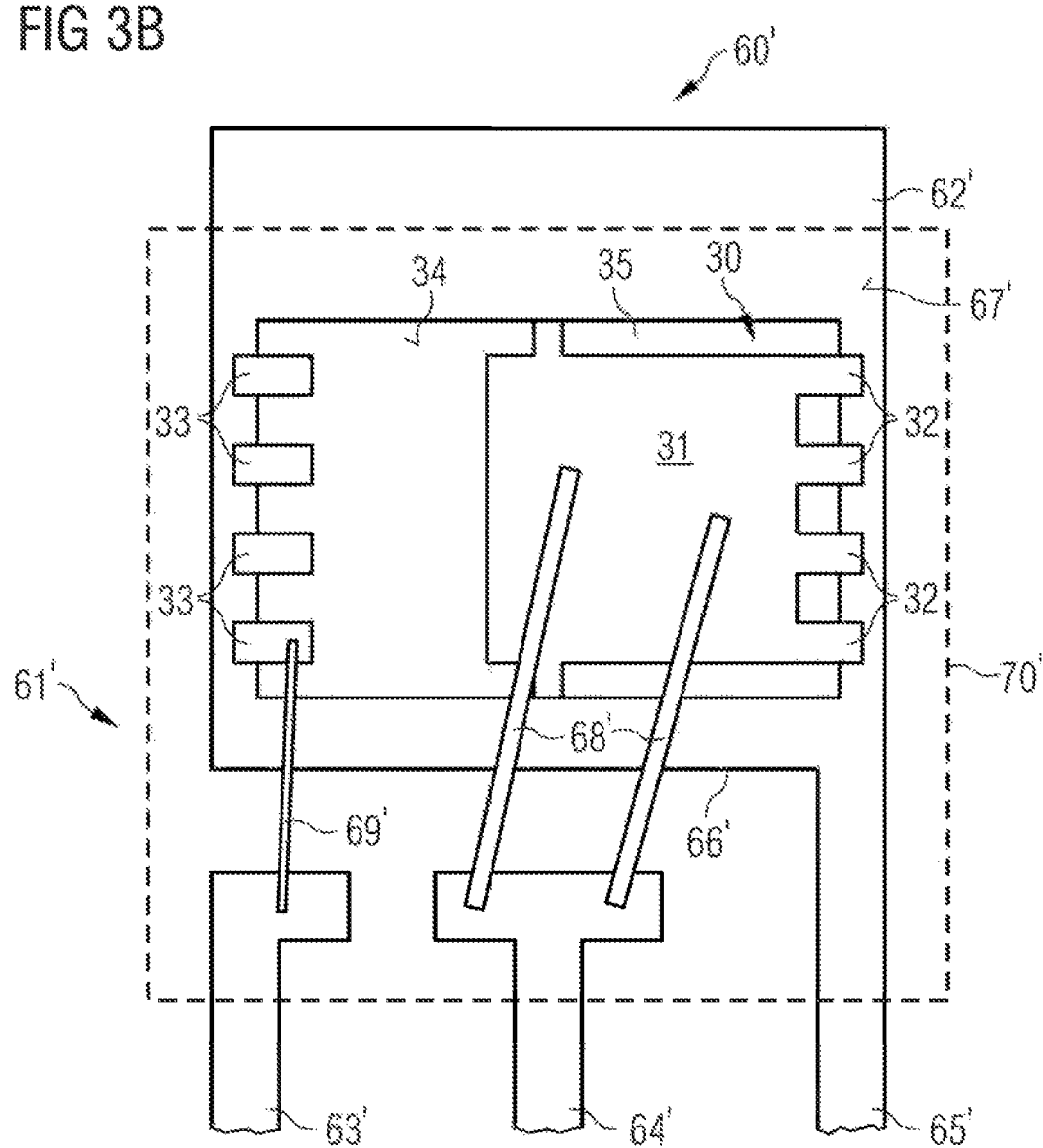

US 9,991,183 B2

SEMICONDUCTOR COMPONENT HAVING INNER AND OUTER SEMICONDUCTOR COMPONENT HOUSINGS

PRIORITY CLAIM

This application claims priority to German Patent Application No. 10 2014 114 933.5 filed on 15 Oct. 2014, the content of said application incorporated herein by reference in its entirety.

BACKGROUND

A semiconductor chip typically is provided in the form of a semiconductor component with a housing. The semiconductor component can include a carrier for the semiconductor chip, outer contact surfaces and an inner redistribution structure, which electrically connects the semiconductor chip with the outer contact surfaces. The semiconductor component can also include a plastic housing composition, which serves as a housing and surrounds the semiconductor chip and the inner redistribution structure, to protect them from the environment. The carrier can be a leadframe or a rewiring substrate. One or more bonded wires and/or contact clips can be made available as an inner redistribution.

SUMMARY

According to an embodiment of a semiconductor component, the semiconductor component comprises an inner semiconductor component housing and an outer semiconductor component housing. The inner semiconductor component housing includes a semiconductor chip, a first plastic housing composition and first housing contact surfaces. At least side faces of the semiconductor chip are embedded in the first plastic housing composition and the first housing contact surfaces are free of the first plastic housing composition and comprise a first arrangement. The outer semiconductor component housing includes a second plastic housing composition and second housing contact surfaces which comprise a second arrangement. The inner semiconductor component housing is situated within the outer semiconductor component housing and is embedded in the second plastic housing composition. At least one of the first housing contact surfaces is electrically connected with at least one of the second housing contact surfaces.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2a shows a schematic side view of a semiconductor component, FIG. 2b shows a schematic view of the underside of the semiconductor component, FIG. 2c shows a schematic view of the top side of the semiconductor component.

FIG. 3b shows a view from above of a semiconductor component according to a third embodiment.

DETAILED DESCRIPTION

Figure 1:
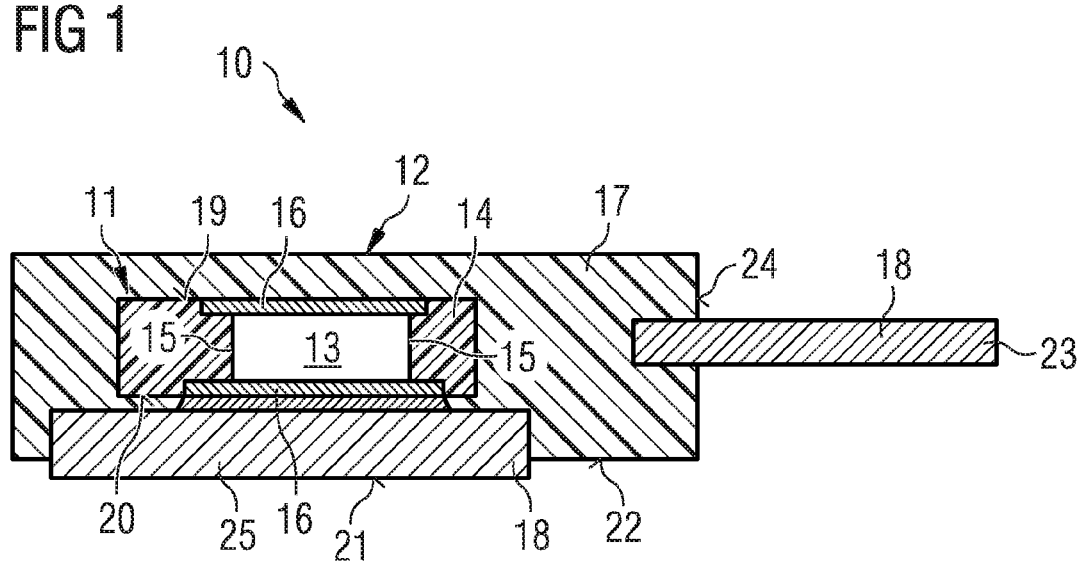
FIG. 1 shows a schematic cross section of a semiconductor component according to a first embodiment.

FIG. 1 shows a schematic cross section of a semiconductor component 10 according to a first embodiment.

The semiconductor component 10 includes an inner semiconductor component housing or package 11 and an outer semiconductor component housing or package 12. The inner semiconductor component housing 10 includes a semiconductor chip 13, a first plastic housing composition 14 and first housing contact surfaces 16. At least side faces 15 of semiconductor chip 13 are embedded in the first plastic housing composition 14. The first housing contact surfaces 16 lie free from the first plastic housing composition 14 and include a first arrangement.

The outer semiconductor component housing 12 includes a second plastic housing composition 17 and second housing contact surfaces 18, which include a second arrangement. The inner semiconductor component housing 11 is situated within the outer semiconductor component housing 12 and is embedded in the second plastic housing composition 17. At least one of the first housing contact surfaces 16 of inner semiconductor component housing 11 is electrically connected with at least one of the second housing contact surfaces 18 of second semiconductor component housing 12.

Semiconductor component 10 thus includes a first semiconductor component housing 11, which itself includes a first plastic housing composition 14, in which the semiconductor chip 13 is embedded. This first plastic housing composition 14 is embedded in the second plastic housing composition 17 of outer semiconductor component housing 12. The arrangement of semiconductor component 10 can thus be viewed as a so-called housing-in-housing or package-in-package component.

Consequently, semiconductor chip 13 can be mounted in a first type of housing with first housing contact surfaces 16 with a first arrangement in a second type of housing with second housing contact surfaces 18 with a second arrangement, so that semiconductor chip 13 can be driven via the second housing contact surfaces 18 of outer semiconductor component housing 12. Semiconductor component 10 thus has an electrically-conductive redistribution structure between the first housing contacts 16 of inner semiconductor component housing 11 and the second housing contacts 18 of outer semiconductor component housing 12.

The first arrangement can be spatially different from the second arrangement and/or the type of contact surfaces of the first arrangement may differ from the type of contact surfaces of the second arrangement. For example, the first arrangement may include contact surfaces on opposite sides of the first plastic housing composition, while in the second arrangement the contact surfaces are arranged only on one side of the second plastic housing composition. The contact surfaces of the first arrangement can, for example, be surface-mountable contact surfaces, which are mounted on the upper side of a circuit board and consequently are arranged parallel to the upper side, while the contact surfaces of the second arrangement are pins which are mounted in the circuit board and thus roughly perpendicular to the surface of the circuit board. The number of contact surfaces in the first arrangement and in the second arrangement can also be different.

The housing contact surfaces 16 can, via an electrically-conductive leadframe, be provided with a die pad and leads, or via an electrically insulating substrate, with electrically conductive strip conductors or traces. Additionally, the inner semiconductor component housing 11 includes a redistribution structure which electrically connects the semiconductor chip 13 or electrodes of semiconductor chip 13 with the first housing contact surfaces 16. The redistribution structure can be provided through one or more bonding wires or contact clips.

In the first embodiment, the housing contact surface 21 of the outer semiconductor component housing 12 is formed by an underside of a die pad 25. One of the first housing contact surfaces 16 of the inner semiconductor component housing 11 is situated on the top side of die pad 25 and electrically connected with die pad 25 and thus with the second housing contact surface 21.

In the first embodiment, the first housing contact surfaces 16 are situated on two opposite surfaces 19, 20 of the inner semiconductor component housing 11 and are surface-mountable contact surfaces. The second housing contact surfaces 18 of the outer semiconductor component housing 12 have a differing arrangement, wherein one contact surface 21 is situated on the underside 22 of the second plastic housing composition 17 and three additional ones on the second housing contact surfaces 23, of which only one is to be seen in the cross section of FIG. 1, projecting outward from a lateral edge 24 of the second plastic housing composition 17. The three additional second housing contact surfaces 23 provide contacts in the form of pins.

The inner semiconductor component housing 11 and/or the outer semiconductor component housing 12 can comply with a JEDEC standard (JEDEC Solid State Technology Association, formerly the Joint Electron Device Engineering Council (JEDEC)). For example, the inner semiconductor component housing 11 can comply with the JEDEC standard of a Super-SO8 housing and the outer semiconductor component housing 12 can comply with the JEDEC standard of a TO220-3 or TO220-5 housing.

In one embodiment, the first arrangement includes three first housing contact surfaces 16, wherein two of these first housing contact surfaces 16 lie free of the first plastic housing composition 14 in the second surface 19, and one housing contact surface 16 lies freely in the first contact surface 20 and is mounted on die pad 25. This arrangement can be used for a semiconductor chip 13 with a vertical transistor, wherein the source electrode is situated on a first surface of semiconductor chip 13 and the gate electrode and the drain electrode are arranged on a second surface of semiconductor chip 13, which lies opposite the first surface.

This vertical transistor can be mounted in a so-called source-down arrangement on die pad 25 of the outer semiconductor component 12, wherein the drain electrode and gate electrode are directed upward within outer semiconductor component housing 12. A vertical transistor can thus be provided with the aid of an inner semiconductor component housing 11 in a TO220-3 housing in a so-called source-down arrangement.

In one embodiment the first surface of semiconductor component housing 11 includes a source contact surface and the second surface of the semiconductor component housing 11 includes at least one second source contact surface. In this embodiment, the first arrangement can include four first housing contact surfaces, wherein three of these first housing contact surfaces lie free from the first plastic housing composition in the second surface, and one lies free from the first plastic housing composition in the first surface.

In one embodiment the semiconductor chip 13 includes a first load electrode and a control electrode on a first surface and a second load electrode on a second surface. In the case where the semiconductor chip 13 is a vertical MOSFET transistor, the first load electrode is a source electrode; the control electrode, a gate electrode; and the second load, a drain electrode. In the case where semiconductor chip 13 is a vertical IGBT transistor, the first load electrode can be an emitter electrode; the control electrode, a gate electrode; and the second load electrode, a collector electrode. In the case where semiconductor 13 is a vertical BJT transistor, the first load electrode can be an emitter electrode; the control electrode, a base electrode; and the second load electrode, a collector electrode.

The inner semiconductor component housing 11 includes an redistribution structure, by which semiconductor chip 13 is electrically connected with the first housing contact surface. Within the inner semiconductor component housing 11, the second load electrode of semiconductor chip 13 can be situated on an upper side of a die pad and be electrically connected with the die pad. An underside of the die pad forms one of the first housing contact surfaces.

The redistribution structure of the inner semiconductor component housing 11 can include a contact clip, wherein an underside of a contact clip is situated on the first load electrode of the semiconductor chip, and an upper side of the contact clip forms one of the first housing contact surfaces 16. Additionally, the contact clip can make electrical contact with one or more of the first housing contact surfaces. The first load electrode can also be electrically connected with one of the first housing contact surfaces by means of one or more bonding wires. The control electrode can be electrically connected with one of the first housing contact surfaces by means of a bonding wire.

The inner semiconductor component housing 11 is electrically connected with semiconductor component housing 12 by means of an additional redistribution structure. This additional redistribution structure can be provided by bonding wires and/or contact clips and/or direct electrically-conductive connections like a soldered layer or electrically conductive adhesive. In one embodiment, one of the first housing contact surfaces in the second surface of the inner semiconductor component housing 11, for example the gate contact surface, can be electrically connected with one of the second housing contact surfaces of the outer semiconductor component housing 12 by means of a bonding wire. A large-area contact surface of the inner semiconductor component housing 11, like a drain contact surface in the second surface, can be electrically connected with one of the second housing contact surfaces of the outer semiconductor component housing 12 by means of at least one bonding wire or by means of a contact clip. A large-area contact surface of the inner semiconductor component housing 11, like a source contact surface in the first surface, can be directly mounted on one of the second housing contact surfaces of the outer semiconductor component housing 12, for example a die pad, with an electrically conductive layer, and thus be electrically connected.

In one embodiment, the inner semiconductor component housing 11 complies with the JEDEC standard of a Super-SO8 housing, wherein the second surface includes a die pad and eight contact surfaces, which are situated on opposite edges. The second upper surface includes a large-area contact surface, which is provided from the underside of the die pad and makes a transition into four edge contact surfaces. Four smaller contact surfaces are situated on the opposite edge.

If this semiconductor component housing 11 with a Super-S08 housing includes a transistor, the drain electrode is mounted on the die pad and electrically connected. Three of the four additional small contact surfaces are coupled with the source electrode and one is coupled with the gate electrode. Additionally, the first surface of the semiconductor component 11 includes an additional contact surface, which is coupled with the source electrode.

In one embodiment, in addition to the inner semiconductor component housing with a semiconductor chip, the semiconductor component includes a further semiconductor device. The semiconductor device includes a second semiconductor chip with a first surface and a second surface, which is opposite the first surface. In one embodiment the semiconductor device includes a transistor, especially a vertical power transistor. The transistor can include a first load electrode and a control electrode, which is arranged on the first surface, as well as a second load electrode, which is arranged on the second surface. The second load electrode is situated on the die pad of the outer semiconductor component housing and is electrically connected to the die pad. The semiconductor device can be embedded in the second plastic housing composition.

In one embodiment, the first semiconductor component housing and the semiconductor device form a half-bridge circuit. Thus, in this embodiment form, the semiconductor device and the inner semiconductor component housing includes a transistor. For example, the die pad of the outer semiconductor component housing can form a node of the half-bridge circuit, if the second load electrode of the semiconductor device, like the drain electrode, and the first load electrode of the first semiconductor component housing, like the source electrode, are placed on the die pad and electrically connected with the die pad. The semiconductor component with the half-bridge circuit can comply with a JEDEC standard. For example, the semiconductor component can comply with the JEDEC standard of a TO220-5 housing. The first semiconductor component housing can comply with the JEDEC standard of a Super-SO8 housing.

Figure 2D:
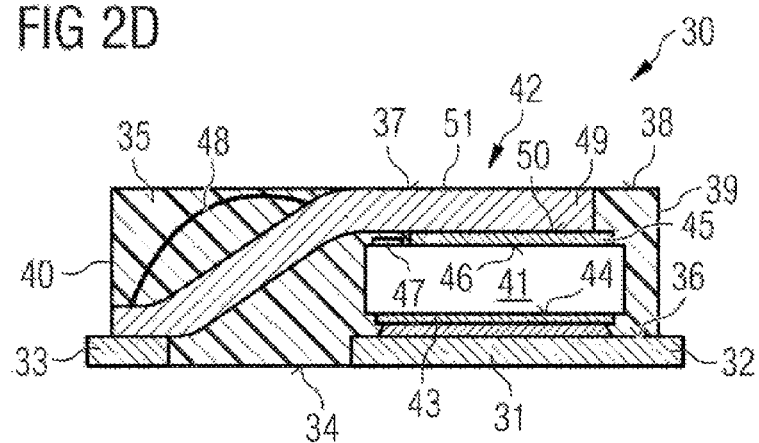
FIG. 2d shows a schematic cross section of the semiconductor component.

FIG. 2a shows a schematic side view of a semiconductor component housing 30, FIG. 2b shows a schematic view of the underside, FIG. 2c shows a schematic view of the upper side, and FIG. 2d shows a schematic cross section of the semiconductor component housing 30.

The semiconductor component housing 30 complies with the JEDEC standard of a Super-SO8 housing. Thus, the semiconductor component housing 30 includes a die pad 31, which extends on one edge into four outer contacts 32. Four additional contacts 33 are situated next to the opposite side of die pad 31 and placed at a distance from die pad 31. Die pad 31 and the outer contacts 32, 33 are provided by an electrically conductive leadframe, of copper for example. The outer contacts 32, 33 lie in one plane and provide surface-mountable contact surfaces, which can be arranged to be coplanar to, or parallel with, the underside 34 of semiconductor component housing 30.

Additionally, semiconductor component housing 30 includes a plastic housing composition 35, in which at least the upper side 36 of die pad 31 and the inner areas of contact connections 32, 33 are embedded, so that outer contacts 32, 33 protrude out from two opposite edges 39, 40 of plastic housing composition 35. The underside of die pad 31 is free of plastic housing composition 35, and also provides a contact surface of semiconductor component housing 30, which is electrically connected with the outer contacts 32.

Moreover, semiconductor component housing 30 includes an additional contact surface 37, which is situated in the upper side 38 of semiconductor component housing 30, and is roughly coplanar with the upper side of plastic housing composition 35. The additional contact surface 37 is free from the plastic housing composition 35. Consequently, semiconductor component housing 30 includes contact surfaces 32, 33, 37 on two opposite sides.

The schematic cross section of FIG. 2d depicts the semiconductor chip 41 and the inner redistribution 42. Semiconductor chip 41 includes a vertical power transistor and thus a first load electrode 43 on an underside 44; a second load electrode 45 on an upper side 46; and a control electrode 47, which is also situated on the upper side 46 of semiconductor chip 41.

The first load electrode 43 is a drain electrode and is mounted on the upper side 36 of die pad 31, and is electrically connected with die pad 31. The second load electrode 45 is a source electrode and the control electrode 47 is a gate electrode, because in the embodiment depicted, the vertical power transistor is a MOSFET transistor.

The inner redistribution 42 connects electrodes 43, 45, 47 of the transistor with outer contacts 32, 33 of semiconductor component housing 30. The inner redistribution 42 includes a bonding wire 48, which electrically connects the gate electrode with one of the outer contacts 33. The source electrode 40 is electrically connected by means of a contact clip 49 with three of the outer contacts 33. The underside 50 of contact clip 49 is thus mounted on the source electrode 45, for example, via a soldered layer. The upper side 51 of a part of contact clip 49, which is situated above source electrode 45, lies free from the plastic housing composition 45 and thus provides the additional contact surface 37 in the upper side 38 of semiconductor component housing 30.

Semiconductor component housing 30 can be situated in an additional outer semiconductor component housing, to provide a semiconductor component according to one of the present embodiments.

Figure 3A:
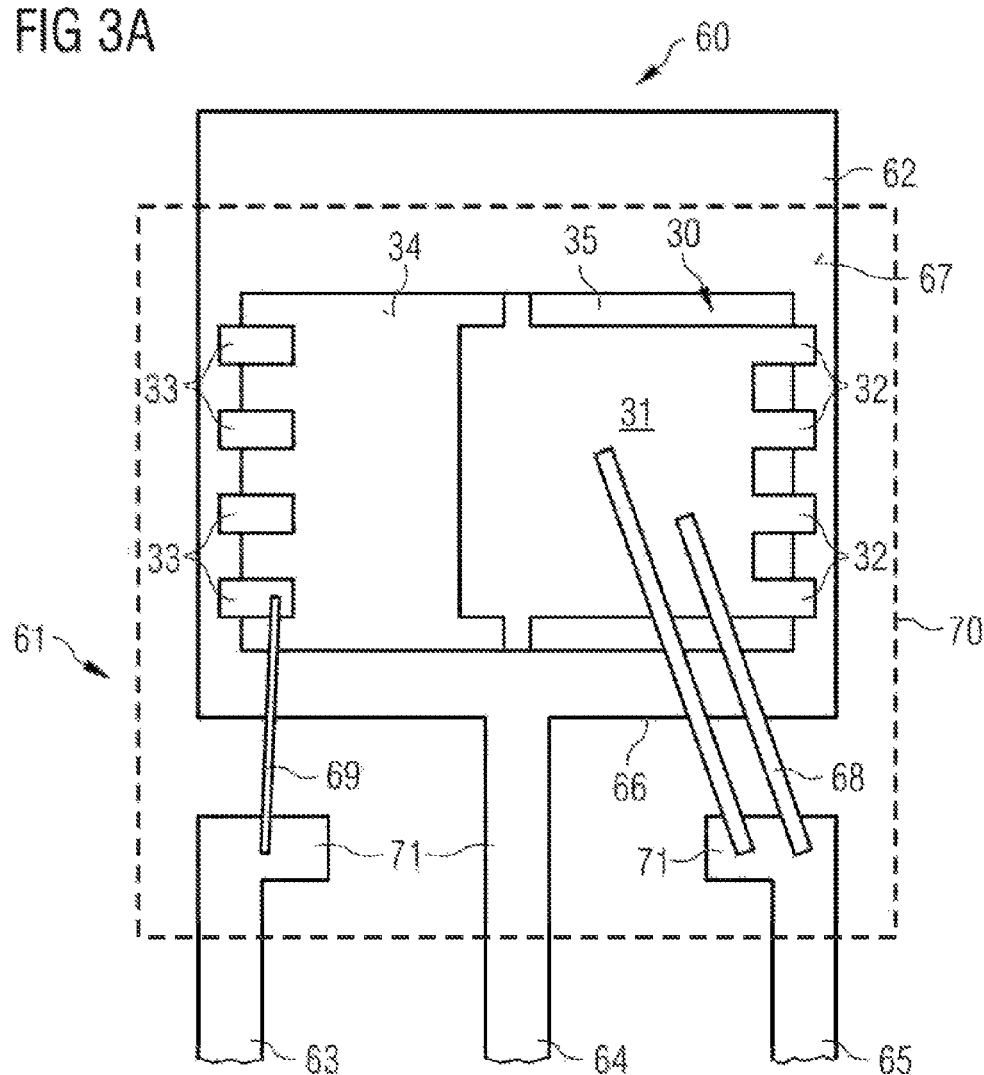
FIG. 3a shows a view from above of a semiconductor component according to a second embodiment.

FIG. 3a shows a semiconductor component 60 according to a second embodiment with the inner semiconductor component housing 30 that is depicted in FIGS. 2a-2d.

The semiconductor component 60 includes an outer semiconductor component housing 61, which complies with the JEDEC standard of a TO220-3 housing. The outer semiconductor component housing 61 thus includes a die pad 62 and three leads 63, 64, 65, which are situated on one side 56 of die pad 62, wherein the middle lead 64 projects out from die pad 62. The two outer leads 63 and 65 are placed at a distance from die pad 62. Leads 63, 65 are situated in a plane which is situated above the plane of the upper side 67 of die pad 62.

Semiconductor component 30 is situated on the upper side 67 of die pad 62 of outer semiconductor component housing 61 and forms the inner semiconductor component of the arrangement. Especially the contact surface 37, which is provided by the free-standing upper side 51 of contact clip 49, is mounted on the upper side 67 of die pad 62, and thus is electrically connected with die pad 62 and the center lead 64. The upper side 51 of inner semiconductor component housing 30 is thus directed downward in semiconductor component 60, so that the vertical power transistor 41 is situated in a so-called source-down arrangement in semiconductor component 60.

The underside 34 of semiconductor component housing 30 is thus situated within outer semiconductor component housing 61 and directed upwards. The second load electrode 43 is electrically connected with lead 65 of the outer semiconductor component housing 61 by means of one or more bonding wires 68. The control electrode 33 is electrically connected with lead 63 by means of a bonding wire 69. The outer semiconductor component housing 61 additionally includes a plastic housing composition 70, in which the inner areas 71 of leads 63, 64, 65 and at least the upper side 66 of the area of die pad 62, on which the inner semiconductor component housing 30 is mounted, and the inner semiconductor component housing 30 and the bonding wires 68, 69 are embedded.

One part of die pad 62, on which the semiconductor chip is not mounted, can project out from plastic housing composition 70 and constitute a heat sink. This free-standing part of die pad 62 can include an opening, by which semiconductor component 60 can be secured onto an additional substrate or carrier. Leads 63, 64, 65 project out from one side 72 of plastic housing composition 70 and are pins, which can be mounted in openings in a circuit board.

Semiconductor component 60 thus includes an electrically-conductive redistribution structure 61, which electrically connects the leads 32, 33 of inner semiconductor component housing 30 with leads 63, 64, 65 of outer semiconductor component housing 61. Consequently a transistor 41 can be mounted in a TO 220-3 housing in a so-called source-down arrangement. Transistor 41 is not only sheathed by the first plastic housing composition 35 of semiconductor component housing 30, but also by the second plastic housing composition 70 of outer semiconductor component housing 61.

FIG. 3b depicts a semiconductor component 60' according to a third embodiment, which includes the semiconductor component 30 as an inner semiconductor component housing.

The semiconductor component 60' includes an outer semiconductor component housing 61', which complies with the JEDEC standard of a TO220-3 housing. The outer semiconductor component housing 61' thus includes one die pad 62' and three leads 63', 64', 65', which are situated on one side 66' of die pad 62'.

Semiconductor component 60' of the third embodiment differs from semiconductor component 60 of the second embodiment in the arrangement of the lead, which projects out from die pad 62'. In this third embodiment, the right outer lead 65' projects out from die pad 62'. The two leads 63' and 64' are at a distance from die pad 62. This arrangement of leads 63', 64', 65', makes possible a standard pin arrangement of gate—drain—source in a TO220-3 housing with a transistor with a so-called Source-Down arrangement. With semiconductor component 60 of the second embodiment, the pin arrangement is gate—source—drain.

As with the second embodiment, semiconductor component 30 is situated on the upper side 67' of die pad 62' of outer semiconductor component housing 61', and forms the inner semiconductor component of the arrangement. The contact surface 37', which is provided by the free-standing upper side 51' of contact clip 49', is, as with the second embodiment, mounted on the upper side 67' of die pad 62 and is thus electrically connected with die pad 62' and outer lead 65'.

In semiconductor component 60', the second load electrode 43 is electrically connected with center lead 64' of outer semiconductor component housing 61' by means of one or more bonding wires 68'. As with the second embodiment, control electrode 33 is electrically connected with lead 63' by means of a bonding wire 69'. The outer semiconductor component housing 61' additionally includes a plastic housing composition 70', in which the inner areas 71' of leads 63', 64', 65', and at least the upper side 62' of the area of die pad 62', on which the inner semiconductor component housing 30 is mounted, and inner semiconductor component housing 30 and bonding wires 68', 69' are embedded.

Figure 4:
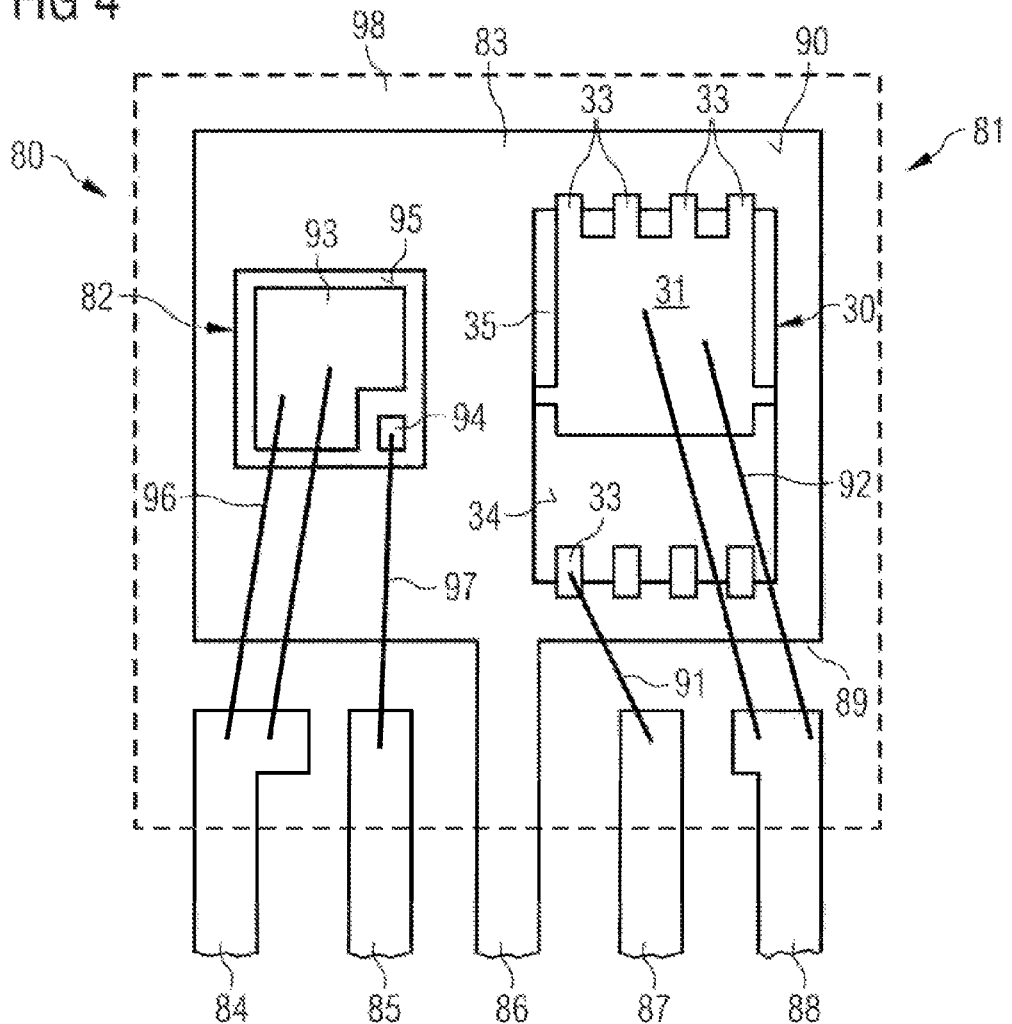
FIG. 4 shows a semiconductor component according to a fourth embodiment with a semiconductor component part and a semiconductor component.
Figure 5:
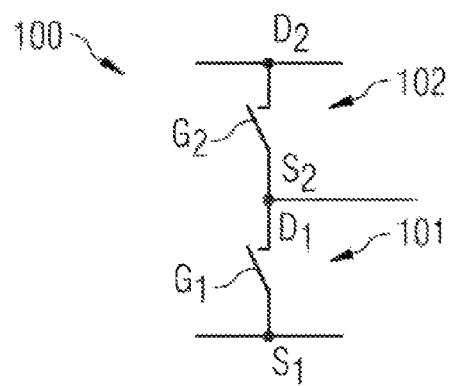
FIG. 5 shows a half-bridge circuit.

FIG. 4 shows a semiconductor component 80 according to another embodiment, which includes an inner semiconductor component housing 30, an outer semiconductor component housing 81 and an additional semiconductor device 82. The additional semiconductor device 82 includes no housing and no plastic housing composition. The inner semiconductor component housing 30 and the semiconductor device 82 can be used to provide a half-bridge circuit, as depicted in FIG. 5.

A half-bridge circuit 100 includes two transistors 101 and 102, which, in one embodiment, can be n-type MOSFETs. The source electrode S1 of the first transistor 101 is grounded, the drain electrode D1 of the first transistor 101 is electrically connected with the source electrode S2 of the second transistor 102, and forms the node of the half-bridge circuit and the drain electrode D2 of the second transistor is coupled with the high-voltage attachment. The gate electrode G1 of first transistor 101 and the gate electrode G2 of second transistor 102, can be independently switched, for example via a gate driver. The first transistor 101 can be designated as the Low Side Switch, and the second transistor 102 can be designated as the High Side Switch of half-bridge circuit 100.

The outer semiconductor component housing complies with the JEDEC standard of a TO220-5 housing, and includes one die pad 83 and five leads 84, 85, 86, 87, 88, which are situated in a row next to one side 89 of die pad 83. The center lead 86 projects out from die pad 83. The additional leads 84, 85, 87, 88 are at a distance from the side 89 of die pad 83.

Semiconductor component housing 30 is mounted on the upper side 90 of die pad 83, so that the underside 34 of semiconductor component housing 30 is directed upwards, and the upper side 48 is directed downwards. The additional contact surface 37 of contact clip 49 is mounted on the upper side 90 of die pad 83, so that additional contact surface 37 is electrically connected with die pad 83. The gate contact surface 33 is electrically connected via a bonding wire 91 with lead 87. The drain contact surface of die pad 31 is electrically connected with the lead 89 of outer semiconductor component housing 81 by means of one or more bonding wires 92.

The semiconductor device 82 is a vertical power transistor in this embodiment. Semiconductor device 82 includes a first load electrode 93 and a control electrode 94 on an upper side 95 and a second load electrode on its underside. In this embodiment, the power electrode is a vertical MOSFET, so that the first load electrode 93 is a source electrode; the control electrode 94 is a gate electrode; and the second load electrode, not shown, is a drain electrode.

The drain electrode of semiconductor device 82 is mounted on the upper side 90 of die pad 83 and electrically connected with die pad 83 and thus with source contact surface 37 and the source electrode of the transistor of semiconductor component housing 30. The source electrode 93 of semiconductor device 82 is electrically connected by means of one or more bonding wires 96 with lead 84 of outer semiconductor component housing 81. The gate electrode 94 is electrically connected with lead 85 by means of a bonding wire 97. The semiconductor device 82 and semiconductor component housing 30 are embedded in the plastic housing composition 98 of outer semiconductor component 81.

Thus the semiconductor component device 82 provides the first transistor 101, and semiconductor component housing 30 provides the second transistor 102, of half-bridge circuit 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    an inner semiconductor component housing comprising a first leadframe having a die pad and a plurality of leads, a semiconductor chip attached to the die pad, and a first plastic housing composition, wherein at least side faces of the semiconductor chip are embedded in the first plastic housing composition, wherein the die pad and the leads of the first leadframe are partly embedded in the first plastic housing composition so as to form first housing contact surfaces which are free of the first plastic housing composition and yield a first arrangement; and
    an outer semiconductor component housing comprising a second plastic housing composition and a second leadframe having a die pad and a plurality of leads, wherein the die pad and the leads of the second leadframe are partly embedded in the second plastic housing composition so as to form second housing contact surfaces which are free of the second plastic housing composition and yield a second arrangement,
    wherein the inner semiconductor component housing is situated within the outer semiconductor component housing on the die pad of the second leadframe and is embedded in the second plastic housing composition,
    wherein at least one of the first housing contact surfaces is electrically connected with at least one of the second housing contact surfaces.

2. The semiconductor component of claim 1, wherein the leads of the second leadframe are situated next to one side of the die pad of the second leadframe, and wherein a first one of the first housing contact surfaces is situated on an upper side of the die pad of the second leadframe and is electrically connected with the die pad of the second leadframe.

3. The semiconductor component of claim 2, wherein the inner semiconductor component housing comprises a first surface, a second surface which lies opposite the first surface, wherein a first one of the first housing contact surfaces is free from the first plastic housing composition in the first surface, is situated on the upper side of the die pad of the second leadframe, and is electrically connected with the die pad of the second leadframe, and wherein a second one of the first housing contact surfaces is free from the first plastic housing composition in the second surface.

4. The semiconductor component of claim 1, wherein the outer semiconductor component housing complies with a JEDEC standard.

5. The semiconductor component of claim 4, wherein the outer semiconductor component housing complies with the JEDEC standard TO-220-3 or TO-220-5.

6. The semiconductor component of claim 1, wherein the inner semiconductor component housing complies with a JEDEC standard.

7. The semiconductor component of claim 6, wherein the inner semiconductor component housing complies with the JEDEC standard Super-SO8.

8. The semiconductor component of claim 3, wherein the first arrangement comprises three first housing contact surfaces, and wherein two of the three first housing contact surfaces are free from the first plastic housing composition in the second surface.

9. The semiconductor component of claim 8, wherein one of the first housing contact surfaces is electrically connected with one of the second housing contact surfaces by a bonding wire.

10. The semiconductor component of claim 3, wherein the second one of the first housing contact surfaces in the second surface is electrically connected with a first one of the second housing contact surfaces by at least one bonding wire or by a contact clip.

11. The semiconductor component of claim 3, wherein the first arrangement comprises four first housing contact surfaces, and wherein three of the four first housing contact surfaces are free from the first plastic housing composition in the second surface.

12. The semiconductor component of claim 1, wherein the semiconductor chip comprises a first load electrode and a control electrode on a first surface, and a second load electrode on a second surface.

13. The semiconductor component of claim 12, wherein the second load electrode is situated on an upper side of the die pad of the first leadframe and is electrically connected with the die pad of the first leadframe, wherein an underside of the die pad of the first leadframe forms one of the first housing contact surfaces.

14. The semiconductor component of claim 12, wherein an underside of a contact clip is situated on the first load electrode, and wherein an upper side of the contact clip forms one of the first housing contact surfaces.

15. The semiconductor component of claim 12, wherein the control electrode is electrically connected with one of the first housing contact surfaces by a bonding wire.

16. The semiconductor component of claim 12, wherein the first load electrode is electrically connected with one of the first housing contact surfaces by a bonding wire.

17. The semiconductor component of claim 1, further comprising a semiconductor device which includes a semiconductor chip with a first surface and a second surface, which lies opposite the first surface, wherein a first load electrode and a control electrode are situated on the first surface, a second load electrode is situated on the second surface, and the second load electrode is situated on the die pad of the second leadframe and is electrically connected with the die pad of the second leadframe.

18. The semiconductor component of claim 17, wherein the semiconductor device is embedded in the second plastic housing composition.

19. The semiconductor component of claim 17, wherein the first semiconductor component and the semiconductor device form a half-bridge circuit.

20. The semiconductor component of claim 1, wherein the outer semiconductor component housing complies with a JEDEC standard, and wherein the inner semiconductor component housing complies with a JEDEC standard.

\* \* \* \* \*